United States Patent
Sugimoto et al.

(10) Patent No.: US 10,393,523 B2
(45) Date of Patent: Aug. 27, 2019

(54) PHYSICAL QUANTITY SENSOR

(71) Applicant: DENSO CORPORATION, Kariya, Aichi-pref. (JP)

(72) Inventors: Kiyomasa Sugimoto, Kariya (JP); Naoki Yoshida, Kariya (JP); Minekazu Sakai, Kariya (JP); Nobuaki Kuzuya, Kariya (JP)

(73) Assignee: DENSO CORPORATION, Kariya (JP)

( * ) Notice: Subject to any disclaimer, the term of this patent is extended or adjusted under 35 U.S.C. 154(b) by 20 days.

(21) Appl. No.: 15/307,859

(22) PCT Filed: Jun. 11, 2015

(86) PCT No.: PCT/JP2015/002919
§ 371 (c)(1),
(2) Date: Oct. 31, 2016

(87) PCT Pub. No.: WO2015/190104
PCT Pub. Date: Dec. 17, 2015

(65) Prior Publication Data
US 2017/0059320 A1 Mar. 2, 2017

(30) Foreign Application Priority Data
Jun. 12, 2014 (JP) .................. 2014-121690

(51) Int. Cl.
*G01C 19/56* (2012.01)
*G01C 19/5607* (2012.01)
*G01C 19/5614* (2012.01)
*G01C 19/5628* (2012.01)
*G01P 21/00* (2006.01)
(Continued)

(52) U.S. Cl.
CPC ...... *G01C 19/5607* (2013.01); *G01C 19/5614* (2013.01); *G01C 19/5628* (2013.01); *G01C 25/00* (2013.01); *G01P 15/125* (2013.01); *G01P 21/00* (2013.01); *G01P 2015/0814* (2013.01); *H01L 2224/32145* (2013.01); *H01L 2224/48091* (2013.01); *H01L 2224/48145* (2013.01); *H01L 2224/73265* (2013.01); *H01L 2924/16195* (2013.01)

(58) Field of Classification Search
CPC ............ G01C 19/5607; G01C 19/5614; G01C 19/5628; G01C 25/00; G01P 15/125; G01P 21/00
USPC ....................................... 73/504.12
See application file for complete search history.

(56) References Cited

U.S. PATENT DOCUMENTS

2002/0051258 A1  5/2002  Tamura
2006/0082255 A1  4/2006  Kato
(Continued)

FOREIGN PATENT DOCUMENTS

JP  H08-015076 A  1/1996
JP  H10-206273 A  8/1998
(Continued)

*Primary Examiner* — Tarun Sinha
(74) *Attorney, Agent, or Firm* — Posz Law Group, PLC

(57) ABSTRACT

A physical quantity sensor includes a detection unit outputting a detection signal corresponding to a vibration of a vibrating element in an angular velocity sensor, and a self-diagnostic unit self-diagnosing a detection environment of an acceleration sensor and the angular velocity sensor on a basis of the detection signal outputted by the detection unit.

15 Claims, 6 Drawing Sheets

(51) Int. Cl.
*G01C 25/00* (2006.01)
*G01P 15/125* (2006.01)
*G01P 15/08* (2006.01)

(56) References Cited

U.S. PATENT DOCUMENTS

| | | | |
|---|---|---|---|
| 2007/0068266 A1* | 3/2007 | Fujimori | B60C 23/0408 |
| | | | 73/724 |
| 2008/0136000 A1 | 6/2008 | Fischer et al. | |
| 2009/0183568 A1 | 7/2009 | Yamanaka et al. | |
| 2009/0309203 A1* | 12/2009 | Seppala | B81B 7/0038 |
| | | | 257/682 |
| 2010/0025845 A1 | 2/2010 | Merz et al. | |
| 2010/0307246 A1 | 12/2010 | Fujii et al. | |
| 2011/0036167 A1 | 2/2011 | Ohkoshi et al. | |
| 2012/0142136 A1 | 6/2012 | Horning et al. | |
| 2014/0020466 A1 | 1/2014 | Ohkoshi et al. | |
| 2014/0260612 A1* | 9/2014 | Aono | G01C 19/5783 |
| | | | 73/504.12 |
| 2014/0352430 A1 | 12/2014 | Ohkoshi et al. | |

FOREIGN PATENT DOCUMENTS

| | | |
|---|---|---|
| JP | 3512004 B2 | 1/2004 |
| JP | 2006-010659 A | 1/2006 |
| JP | 2010-204061 A | 9/2010 |
| JP | 2013-120179 A | 6/2013 |
| JP | 5321150 B2 | 7/2013 |
| WO | 2015/162888 A1 | 10/2015 |

* cited by examiner

PHYSICAL QUANTITY SENSOR

CROSS REFERENCE TO RELATED APPLICATION

This application is a U.S. national stage application of International Patent Application No. PCT/JP2015/002919 filed on Jun. 11, 2015 and is based on Japanese Patent Application No. 2014-121690 filed on Jun. 12, 2014, the disclosure of which is incorporated herein by reference.

TECHNICAL FIELD

The present disclosure relates to a physical quantity sensor including an acceleration sensor provided with a sensing portion outputting a sensor signal corresponding to acceleration and an angular velocity sensor provided with a sensing portion outputting a sensor signal corresponding to an angular velocity, both of which are housed in a housing space of a common case.

BACKGROUND

A physical quantity sensor disclosed in the related art includes an acceleration sensor provided with a sensing portion outputting a sensor signal corresponding to acceleration and an angular velocity sensor provided with a sensing portion outputting a sensor signal corresponding to an angular velocity, both of which are housed in a housing space of a common case (see, for example, Patent Literature 1).

The acceleration sensor is desirably at rest while no acceleration is applied. Hence, it is preferable that the acceleration sensor detects acceleration under an atmospheric pressure at which air damping (flow resistance of gas) is high. On the contrary, the angular velocity sensor has a vibrating element and detects an angular velocity while the vibrating element is vibrating. It is therefore preferable that the angular velocity sensor detects an angular velocity under a vacuum pressure at which air damping is low for the vibrating element to readily vibrate.

In a case where the acceleration sensor and the angular velocity sensor are housed in the housing space of the common case, for example, a pressure in the housing space is set to a vacuum pressure and the angular velocity sensor is directly installed in the housing space. Meanwhile, the acceleration sensor is installed in the housing space in a state of a package structure in which a sensing portion is hermetically sealed in an airtight chamber set to an atmospheric pressure.

PATENT LITERATURE

Patent Literature 1: JP2013-101132A

SUMMARY

In the physical quantity sensor configured as above, however, a pressure in the housing space and a pressure in the airtight chamber fluctuate when leakage occurs at the airtight chamber in the acceleration sensor of a package structure. In addition, the acceleration sensor outputs a sensor signal corresponding to applied acceleration even when a pressure in the airtight chamber fluctuates. Likewise, the angular velocity sensor outputs a sensor signal corresponding to an applied angular velocity even when a pressure in the housing space fluctuates. In short, once a detection environment changes, acceleration and an angular velocity are detected while detection accuracy has varied. The physical quantity sensor, however, lacks a capability of knowing the detection environment. Accordingly, in a case where various types of processing, such as a vehicle running control, are performed using a sensor signal outputted by the acceleration sensor and a sensor signal outputted by the angular velocity sensor, incorrect processing may possibly be performed.

In view of the foregoing difficulties, an object of the present disclosure is to provide a physical quantity sensor capable of self-diagnosing a detection environment of an acceleration sensor and an angular velocity sensor.

According to an aspect of the present disclosure, the physical quantity sensor includes an acceleration sensor provided with a sensing portion outputting a sensor signal corresponding to acceleration, an angular velocity sensor provided with a sensing portion having a vibrating element that vibrates in a predetermined direction and the sensing portion outputting a sensor signal corresponding to an angular velocity from the sensing portion, and a case having a housing space set to a predetermined pressure and housing the acceleration sensor and the angular velocity sensor in the housing space. At least one of the acceleration sensor and the angular velocity sensor is of a package structure, in which a cap portion is arranged in a sensor portion where the sensing portion is formed and the sensing portion is hermetically sealed in an airtight chamber defined between the sensor portion and the cap portion.

The physical quantity sensor further includes a detection unit outputting a detection signal corresponding to a vibration of the vibrating element in the angular velocity sensor, and a self-diagnostic unit self-diagnosing a detection environment of the angular velocity sensor on a basis of the detection signal outputted by the detection unit. Further, the acceleration sensor is of the package structure and the airtight chamber is set to an atmospheric pressure, and the housing space is set to a vacuum pressure.

Owing to the configuration as above, the detection environment of the angular velocity sensor can be self-diagnosed by the self-diagnostic unit. For example, in the case of a physical quantity sensor in which only the acceleration sensor is of a package structure and a pressure in the housing space is set to a vacuum pressure, the pressure in the housing space (detection environment of the angular velocity sensor) fluctuates when leakage occurs at the airtight chamber in the acceleration sensor of the package structure, in response to which a vibration state of the vibrating element varies. Hence, it can be determined that the detection environment of the angular velocity sensor is abnormal on the basis of the detection signal. It is when leakage occurs at the airtight chamber in the acceleration sensor of the package structure when the detection environment of the angular velocity sensor becomes abnormal. Hence, it can be determined that a detection environment of the acceleration sensor is also abnormal when the angular velocity sensor is abnormal. Consequently, in a case where various types of processing are performed using signals outputted by the acceleration sensor and the angular velocity sensor, performance of incorrect processing can be restricted.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
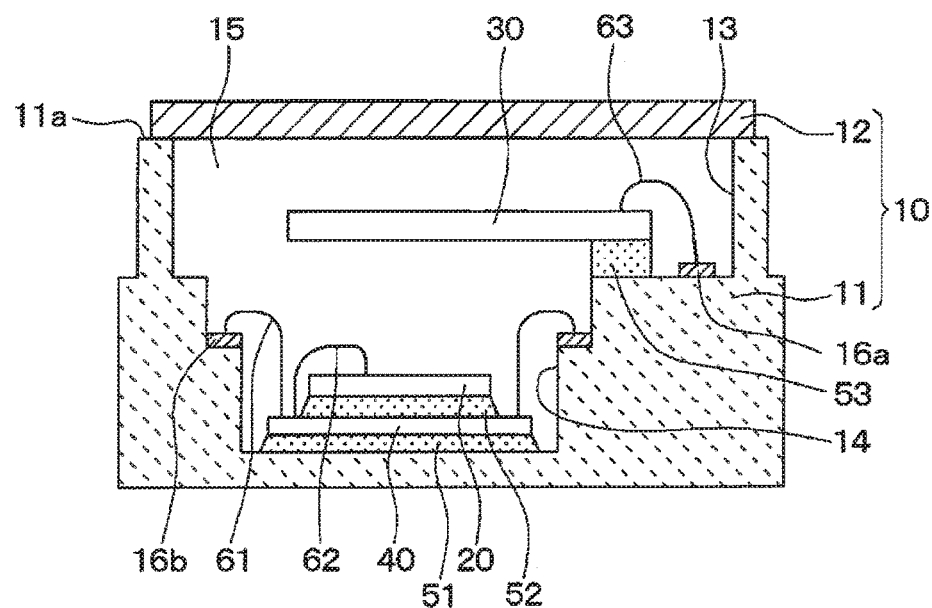
FIG. 1 is a sectional view of a physical quantity sensor according to a first embodiment of the present disclosure.

Hereafter, referring to drawings, embodiments of the present invention will be described. In addition, the substantially same parts and components are indicated with the same reference numeral and will be described in following embodiments.

(First Embodiment)

A first embodiment of the present disclosure will be described with reference to the drawings. As is shown in FIG. 1, a physical quantity sensor includes a case 10 and the case 10 has a housing portion 11 and a lid portion 12.

The housing portion 11 is formed by stacking multiple ceramic layers made of alumina or the like and shaped like a box in which a housing space 15 is defined by providing a first recessed portion 13 in a surface 11a and by providing a second recessed portion 14 in a bottom surface of the first recessed portion 13. In the housing portion 11, internal connecting terminals 16a and 16b are provided to inner wall surfaces (a wall surface of the first recessed portion 13 and a wall surface of the second recessed portion 14) and unillustrated external connecting terminals are provided to outer wall surfaces. The internal connecting terminals 16a and 16b and the external connecting terminals are electrically connected as needed by an unillustrated inner-layer wiring or the like provided inside.

The lid portion 12 is made of metal or the like and bonded to the surface 11a of the housing portion 11 by welding or the like to hermetically seal the housing space 15. In the present embodiment, the housing space 15 is set to a vacuum pressure, for example, 1 Pa.

An acceleration sensor 20, an angular velocity sensor 30, and a circuit board 40 are housed in the housing space 15 of the case 10. More specifically, the circuit board 40 is arranged on a bottom surface of the second recessed portion 14 through an adhesive agent 51 and the acceleration sensor 20 is stacked on the circuit board 40 through an adhesive agent 52. The circuit board 40 is electrically connected to the internal connecting terminal 16b through a bonding wire 61 and the acceleration sensor 20 is electrically connected to the circuit board 40 through a bonding wire 62.

The angular velocity sensor 30 is arranged on the bottom surface of the first recessed portion 13 through an adhesive agent 53. To be more specific, the angular velocity sensor 30 has an outer peripheral portion 313 and the outer peripheral portion 313 is bonded to the adhesive agent 53. The angular velocity sensor 30 is electrically connected to the internal connecting terminal 16a through a bonding wire 63.

The acceleration sensor 20 is of a package structure sealed at an atmospheric pressure and installed in the housing space 15 in a packaged state. The angular velocity sensor 30 is directly installed in the housing space 15. Hence, the acceleration sensor 20 detects acceleration under an atmospheric pressure whereas the angular velocity sensor 30 detects an angular velocity under a vacuum pressure.

A configuration of the acceleration sensor 20, a configuration of the angular velocity sensor 30, and a configuration of the circuit board 40 will now be described.

Figure 2:
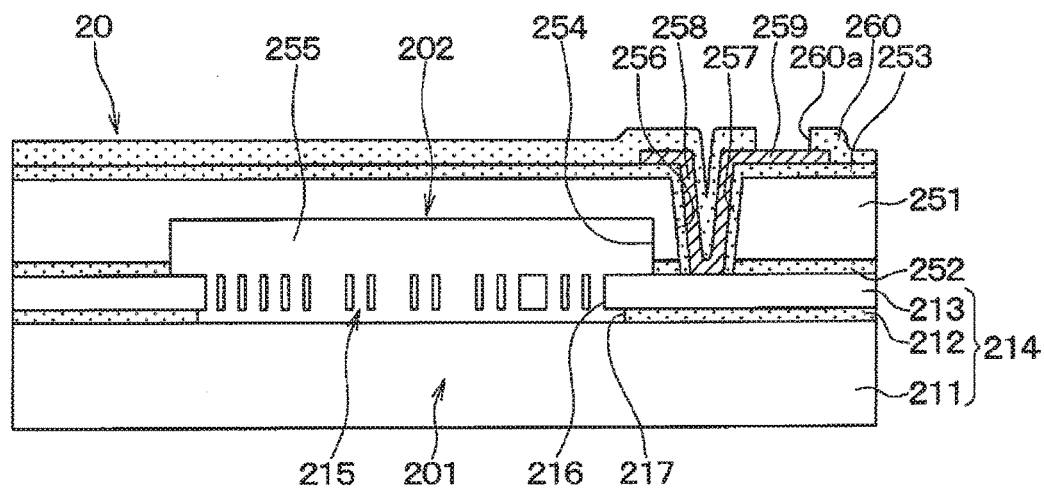
FIG. 2 is a sectional view of an acceleration sensor shown in FIG. 1.

As is shown in FIG. 2, the acceleration sensor 20 is of a package structure including a sensor portion 201 and a cap portion 202.

The sensor portion 201 is formed by using an SOI (Silicon on Insulator) substrate 214 made up of a supporting substrate 211, an insulating film 212, and a semiconductor layer 213, which are stacked sequentially. The supporting substrate 211 and the semiconductor layer 213 are formed of a silicon substrate or the like and the insulating film 212 is formed of an oxide film or the like.

Figure 3:
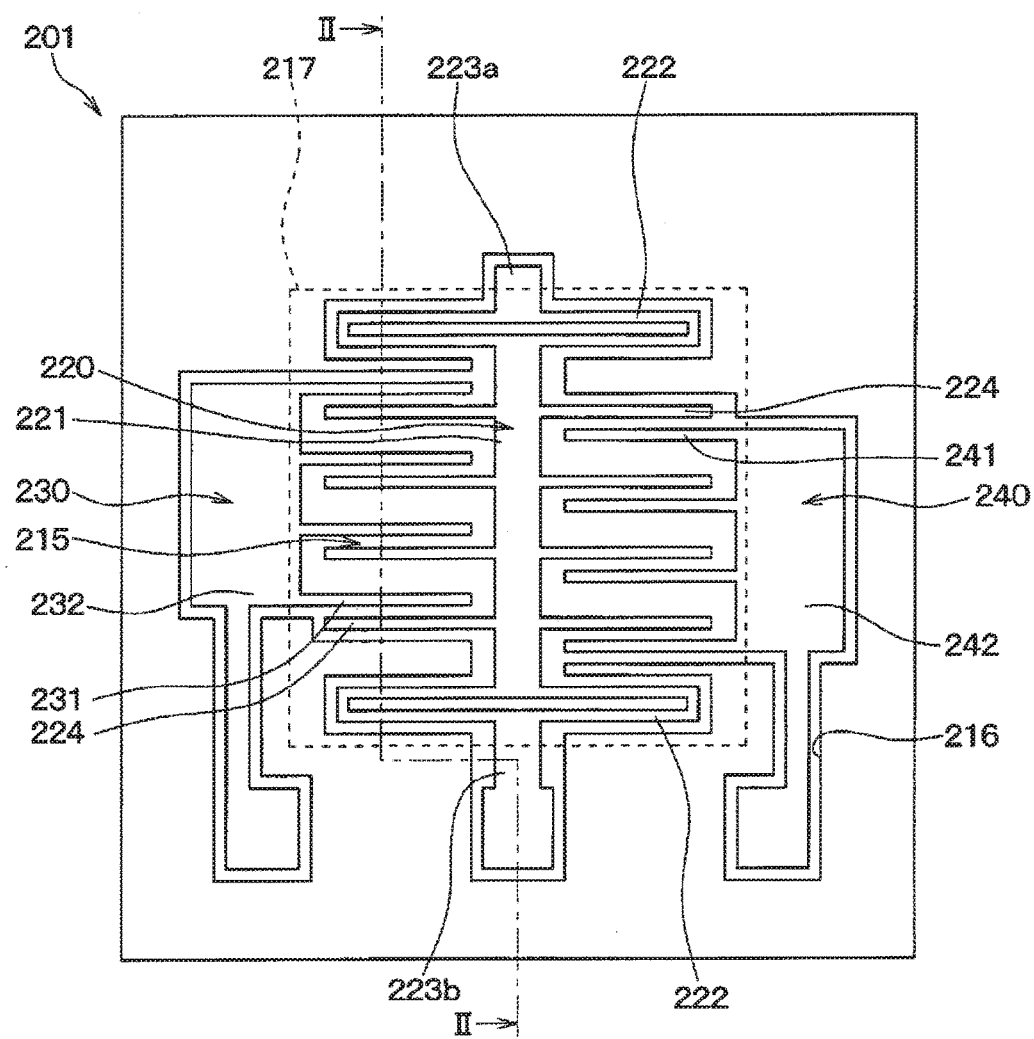
FIG. 3 is a top view of a sensor portion shown in FIG. 2.

As are shown in FIG. 2 and FIG. 3, the SOI substrate 214 is micro-machined in a known manner and a sensing portion 215 is provided. More specifically, by providing a groove portion 216 to the semiconductor layer 213, a movable portion 220, a first fixed portion 230, and a second fixed portion 240 each having a comb-teeth beam structure are provided, and the three beam structures together form the sensing portion 215 outputting a sensor signal corresponding to acceleration.

An opening portion 217 of a rectangular shape is provided to the insulating film 212 by removing a portion corresponding to regions where the beam structures 220, 230, and 240 are provided by sacrifice layer etching or the like.

The movable portion 220 is arranged so as to cross the opening portion 217 and both ends of a weight portion 221 in a longitudinal direction are integrally joined to anchor portions 223a and 223b through beam portions 222. The weight portion 221 is a rectangular shape. The anchor portions 223a and 223b are supported on the supporting substrate 211 through the insulating film 212 at an opening edge portion along the opening portion 217. Consequently, the weight portion 221 and the beam portions 222 face the opening portion 217. The sensor portion 201 of FIG. 2 corresponds to a sectional view taken along the line II-II of FIG. 3.

Each beam portion 222 includes two parallel beams joined at both ends in a rectangular frame shape and has a spring function to displace in a direction orthogonal to a longitudinal direction of the two beams. More specifically, when the beam portion 222 undergoes acceleration including a component in a direction along the longitudinal direction of the weight portion 221, the beam portion 222 forces the weight portion 221 to displace in the longitudinal direction and also allows the weight portion 221 to restore to an original state when acceleration vanishes. Hence, when acceleration is applied, the weight portion 221 joined to the supporting substrate 211 through the beam portions 222 configured as above displaces in a displacement direction of the beam portions 222.

The movable portion 220 includes multiple movable electrodes 224 provided integrally with the weight portion 221 to protrude oppositely to each other from both side surfaces in a direction orthogonal to the longitudinal direction of the weight portion 221. In FIG. 3, the four movable electrodes 224 are provided to protrude from each of a left side and a right side of the weight portion 221 and all of the movable electrodes 224 face the opening portion 217. The respective movable electrodes 224 are provided integrally with the weight portion 221 and the beam portions 222. Hence, when the beam portions 222 displace, the movable electrodes 224 can displace in the longitudinal direction of the weight portion 221 together with the weight portion 221.

The first fixed portion 230 and the second fixed portion 240 are supported on the supporting substrate 211 through the insulating film 212 at the opening edge portion along the opening portion 217 in opposing side portions where the anchor portions 223a and 223b are not supported. In short, the first fixed portion 230 and the second fixed portion 240 are arranged with the movable portion 220 in between. In FIG. 3, the first fixed portion 230 is arranged on a left side on a sheet surface with respect to the movable portion 220 and the second fixed portion 240 is arranged on a right side on the sheet surface with respect to the movable portion 220. The first fixed portion 230 and the second fixed portion 240 are electrically independent from each other.

The first fixed portion 230 and the second fixed portion 240 respectively have multiple first fixed electrodes 231 and multiple second fixed electrodes 241 arranged oppositely parallel to side surfaces of the movable electrodes 224 at predetermined detection intervals and a first wiring portion 232 and a second wiring portion 242 both supported on the supporting substrate 211 through the insulating film 212.

In FIG. 3, the four first fixed electrodes 231 and the four second fixed electrodes 241 are provided and aligned like comb teeth to mesh with clearances among comb teeth of the movable electrodes 224. The first fixed electrodes 231 and the second fixed electrodes 241 are supported, respectively, on the wiring portions 232 and 242 like a cantilever and therefore face the opening portion 217. The above has described the configuration of the sensor portion 201 of the present embodiment.

As is shown in FIG. 2, the cap portion 202 includes an insulating film 252 provided to a substrate 251 made of silicon or the like on a surface of the substrate 251 opposing the sensor portion 201 and an insulating film 253 provided to the other surface of the substrate 251 opposite to the surface of the substrate 251.

In the cap portion 202, the insulating film 252 is bonded to the sensor portion 201 (semiconductor layer 213). In the present embodiment, the insulating film 252 and the sensor portion 201 (semiconductor layer 213) are bonded by, for example, so-called direct bonding by which the insulating film 252 and the semiconductor layer 213 are bonded by activating respective bond surfaces.

A dent portion 254 is also provided to the cap portion 202 in a portion opposing the sensing portion 215. An airtight chamber 255 is defined between the sensor portion 201 and the cap portion 202 by a space including the dent portion 254. The sensing portion 215 provided to the sensor portion 201 is hermetically sealed in the airtight chamber 255. In the present embodiment, the airtight chamber 255 is set to an atmospheric pressure. That is to say, in the present embodiment, the acceleration sensor 20 is of a package structure in which the sensing portion 215 is hermetically sealed in the airtight chamber 255 set to an atmospheric pressure.

In addition, multiple through-holes 256 (only one through-hole 256 is shown in FIG. 2) are provided to penetrate through the cap portion 202 in a stacking direction of the cap portion 202 and the sensor portion 201. More specifically, the respective through-holes 256 are provided to expose predetermined parts of the anchor portion 223b, the first wiring portion 232, and the second wiring portion 242. An insulating film 257 made of TEOS (tetraethyl orthosilicate) or the like is deposited on a wall surface of each through-hole 256. A through-hole electrode 258 made of Al or the like is provided on the insulating film 257 and electrically connected to the anchor portion 223b, the first wiring portion 232, or the second wiring portion 242 as needed. Further, a pad portion 259 electrically connected to the circuit board 40 is provided on the insulating film 253.

A protection film 260 is provided on the insulating film 253, the through-hole electrode 258, and the pad portion 259. The protection film 260 is provided with a contact hole 260a through which the pad portion 259 is exposed.

The above has described the configuration of the acceleration sensor 20. When acceleration is applied to the acceleration sensor 20 configured as above, the weight portion 221 displaces in response to the acceleration and capacitances between the movable electrodes 224 and the first fixed electrodes 231 and between the movable electrodes 224 and the second fixed electrodes 241 vary with such displacement. Hence, a sensor signal corresponding to the acceleration (capacitances) is outputted by the acceleration sensor 20.

Figure 4:
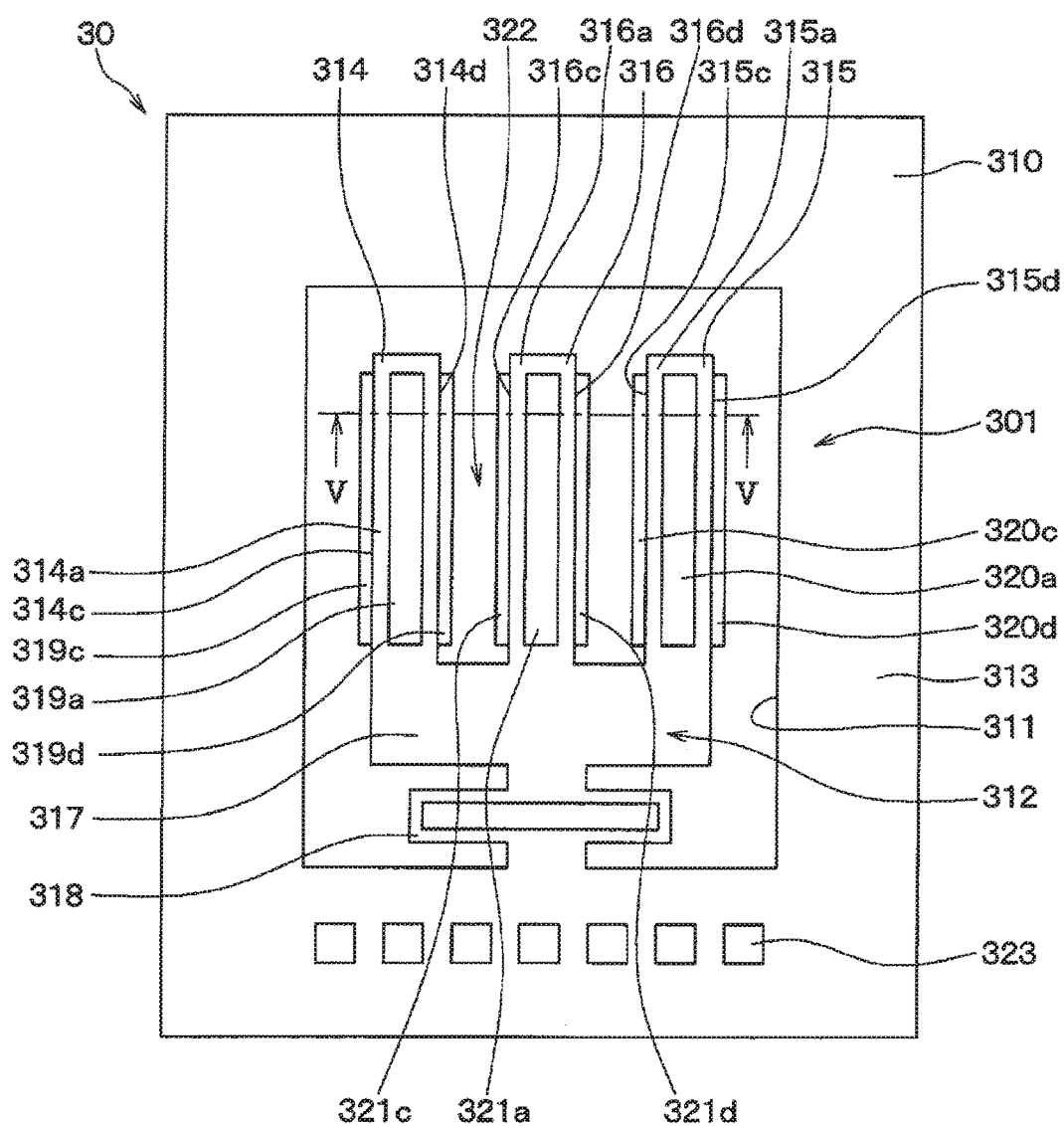
FIG. 4 is a top view of an angular velocity sensor shown in FIG. 1.

A configuration of the angular velocity sensor 30 will now be described. As is shown in FIG. 4, the angular velocity sensor 30 includes a sensor portion 301 formed by using a substrate 310 made of a piezoelectric material, such as crystal and PZT (lead zirconate titanate). The substrate 310 is micro-machined in a known manner and a groove portion 311 is provided. The substrate 310 is divided by the groove portion 311 to a part where a vibrating element 312 is provided and a part where the outer peripheral portion 313 is provided.

The vibrating element 312 includes a first drive reed 314, a second drive reed 315, and a detection reed 316, all of which are held by a base portion 317, and the base portion 317 is fixed to the outer peripheral portion 313 through a beam unit 318. To be more specific, the vibrating element 312 is a so-called tripod-type tuning fork in which the first drive reed 314, the second drive reed 315, and the detection reed 316 protrude from the base portion 317 in a same direction, and the detection reed 316 is situated between the first drive reed 314 and the second drive reed 315.

The beam unit 318 restricts transmission of stress developed at the outer peripheral portion 313 to the vibrating element 312 by easing the stress. However, the beam unit 318 may be omitted. In short, a base portion 317 may be directly joined to the outer peripheral portion 313.

Figure 5:
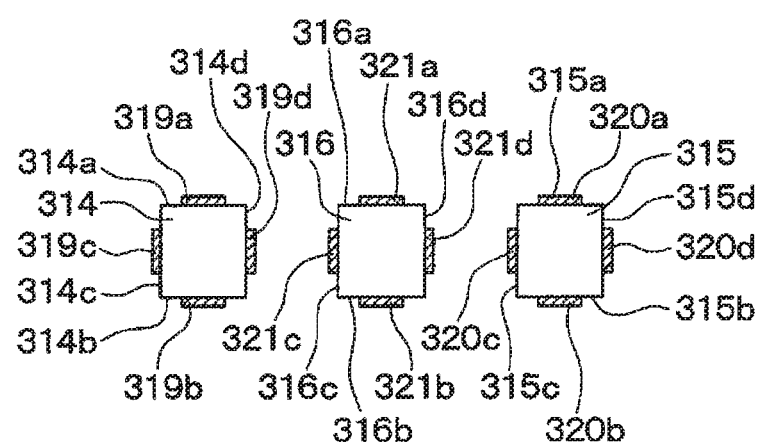
FIG. 5 is a view corresponding to a section taken along the line V-V of FIG. 4.

As are shown in FIG. 4 and FIG. 5, the first drive reed 314, the second drive reed 315, and the detection reed 316 are shaped like rods with a rectangular cross section having surfaces 314a, 315a, and 316a and rear surfaces 314b, 315b, and 316b each parallel to plane directions of the substrate 310, and side surfaces 314c and 314d, 315c and 315d, and 316c and 316d, respectively.

In the first drive reed 314, a drive electrode 319a is provided to the surface 314a, a drive electrode 319b is provided to the rear surface 314b, and common electrodes 319c and 319d are provided to the side surfaces 314c and 314d, respectively. Likewise, in the second drive reed 315, a drive electrode 320a is provided to the surface 315a, a drive electrode 320b is provided to the rear surface 315b, and common electrodes 320c and 320d are provided to the side surfaces 315c and 315d, respectively. Also, in the detection reed 316, a detection electrode 321a is provided to the surface 316a, a detection electrode 321b is provided to the rear surface 316b, and common electrodes 321c and 321d are provided to the side surfaces 316c and 316d, respectively.

In the present embodiment, the first drive reed 314, the second drive reed 315, the detection reed 316, the drive electrodes 319a to 320b, the detection electrodes 321a and 321b, and the common electrodes 319c to 321d together form a sensing portion 322.

As is shown in FIG. 4, the outer peripheral portion 313 is provided with multiple pad portions 323 electrically connected to the drive electrodes 319a to 320b, the detection electrodes 321a and 321b, and the common electrodes 319c to 321d through unillustrated wiring layers or the like and also electrically connected to the circuit board 40.

The above has described the configuration of the angular velocity sensor 30. That point is that the sensing portion 322 in the angular velocity sensor 30 of the present embodiment is not hermetically sealed in an airtight chamber. The angular velocity sensor 30 as above detects an angular velocity while the first drive reed 314 and the second drive reed 315 are vibrating in an alignment direction of the first drive reed 314, the second drive reed 315, and the detection reed 316 (a right-left direction on a sheet surface of FIG. 4).

When an angular velocity is applied within a plane of the sensor portion 301, a pair of Coriolis forces develop at the first drive reed 314 and the second drive reed 315 periodically in opposite orientations in a direction along the protruding direction of the first drive reed 314 and the second drive reed 315 with respect to the base portion 317. Hence, moments induced by the Coriolis forces are transmitted to the detection reed 316 through the base portion 317 and the detection reed 316 starts to vibrate (bend) in the alignment direction of the first drive reed 314, the second drive reed 315, and the detection reed 316. Eventually, charges corresponding to the angular velocity are generated at the detection reed 316. A sensor signal corresponding to the angular velocity (charges) is thus outputted by the angular velocity sensor 30.

When an angular velocity is not applied, moments applied from the first drive reed 314 and the second drive reed 315 to the detection reed 316 through the base portion 317 are in opposite directions and therefore cancelled out with each other. Hence, the detection reed 316 is substantially at rest.

Figure 6:
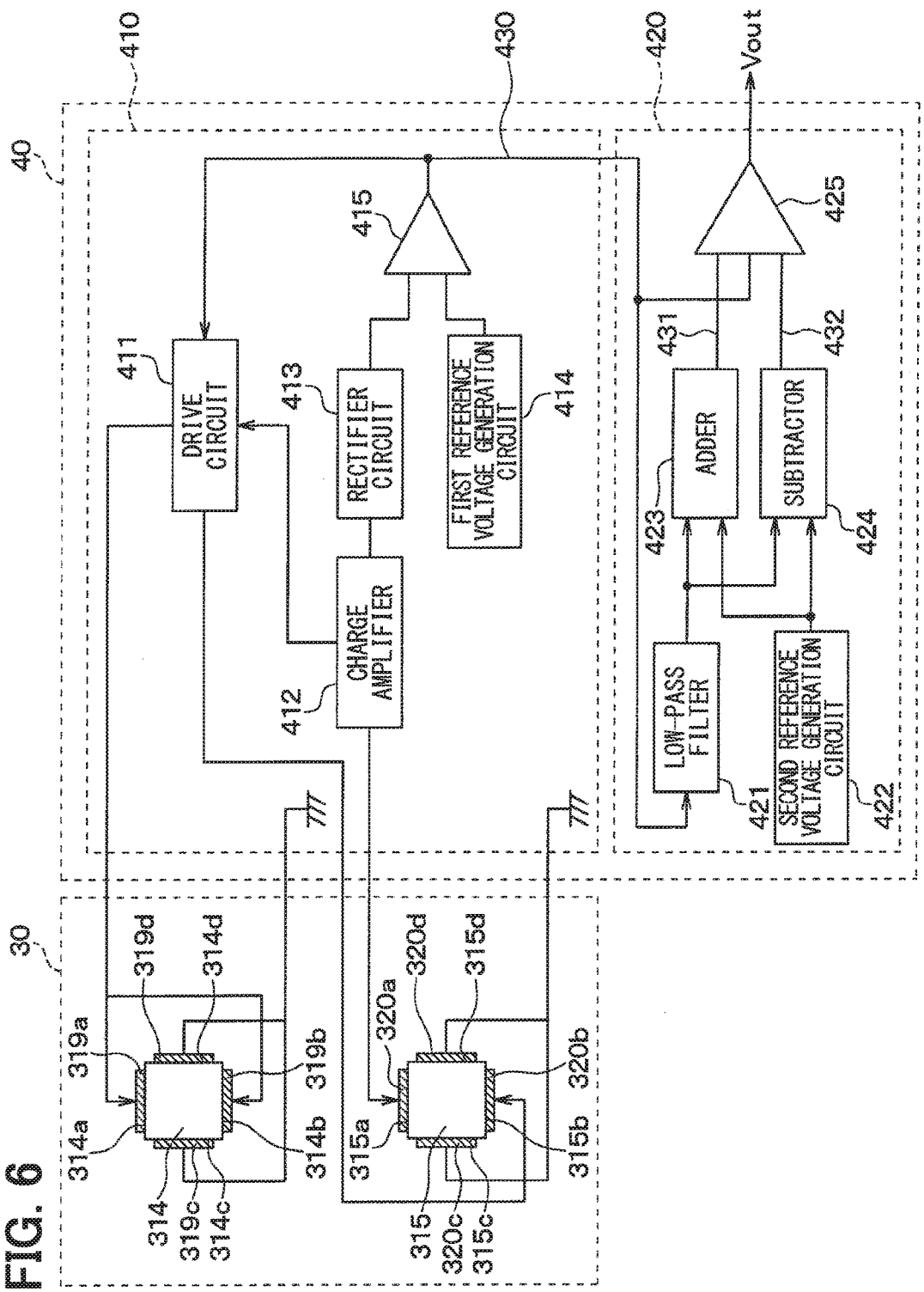
FIG. 6 is a view showing circuit configurations of the angular velocity sensor and a circuit board shown in FIG. 1.

A circuit configuration of the circuit board 40 will now be described. As is shown in FIG. 6, the circuit board 40 has an angular velocity sensor control circuit 410 driving the angular velocity sensor 30 and a self-diagnostic circuit 420. The circuit board 40 also has an acceleration sensor control circuit (not shown) controlling the acceleration sensor 20, a processing circuit (not shown) processing respective sensor signals, and so on. In FIG. 6, the detection reed 316 is omitted.

The angular velocity sensor control circuit 410 has a drive circuit 411, a charge amplifier 412, a rectifier circuit 413, a first reference voltage generation circuit 414, a differential amplifier 415, and so on. The self-diagnostic circuit 420 has a low-pass filter 421, a second reference voltage generation circuit 422, an adder 423, a subtractor 424, a window comparator 425, and so on.

The drive circuit 411 has an AGC (Auto Gain Control) circuit or the like and is connected to the drive electrodes 319a and 319b of the first drive reed 314 and the drive electrode 320b of the second drive reed 315. The drive circuit 411 applies a constant drive signal to the drive electrodes 319a, 319b, and 320b after a gain of the drive signal is adjusted on the basis of a voltage signal inputted by the charge amplifier 412 and a difference signal 430 inputted by the differential amplifier 415. That is to say, the drive circuit 411 adjusts a drive signal to make vibration amplitude of the first drive reed 314 and the second drive reed 315 constant and applies the adjusted drive signal to the drive electrodes 319a, 319b, and 320b.

A pulsed drive signal (carrier) at a predetermined frequency with predetermined amplitude is applied to the drive electrodes 319a and 319b of the first drive reed 314. A drive signal (carrier) applied to the drive electrode 320b of the second drive reed 315 is 180° out of phase with the drive signal (carrier) applied to the drive electrodes 319a and 319b. Consequently, the first drive reed 314 and the second drive reed 315 vibrate in an alignment direction of the first drive reed 314, the second drive reed 315, and the detection reed 316.

The charge amplifier 412 is connected to the drive electrode 320a of the second drive reed 315 and also connected to the drive circuit 411 and the rectifier circuit 413. The charge amplifier 412 converts charges generated at the drive electrode 320a by vibrations of the second drive reed 315 to a voltage signal and inputs the voltage signal to the drive circuit 411 and the rectifier circuit 413.

Charges generated at the drive electrode 320a of the second drive reed 315 vary with a vibration state of the second drive reed 315. That is to say, charges vary with an ambient pressure (detection environment) around the second drive reed 315 (vibrating element 312).

The rectifier circuit 413 is connected to the differential amplifier 415. The rectifier circuit 413 generates a DC voltage comparable to vibration amplitude of the second drive reed 315 from the voltage signal inputted by the charge amplifier 412 and inputs the DC voltage into the differential amplifier 415.

The first reference voltage generation circuit 414 is connected to the differential amplifier 415 and inputs a first reference voltage into the differential amplifier 415.

The differential amplifier 415 is connected to the drive circuit 411, the low-pass filter 421, and the window comparator 425. The differential amplifier 415 inputs the difference signal 430 between the DC voltage inputted by the rectifier circuit 413 and the first reference voltage inputted by the first reference voltage generation circuit 414 into the drive circuit 411, the low-pass filter 421, and the window comparator 425.

As has been described above, because the second drive reed 315 generates charges corresponding to the detection environment, the difference signal 430 outputted by the differential amplifier 415 is also a signal corresponding to the detection environment. Hence, in the present embodiment, the differential amplifier 415 corresponds to a detection unit and the difference signal 430 corresponds to a detection signal.

The low-pass filter 421 has a large time constant and is connected to the adder 423 and the subtractor 424. Upon input of the difference signal 430, the low-pass filter 421 generates an output signal that gradually follows the difference signal 430 and inputs the output signal into the adder 423 and the subtractor 424. That is to say, the low-pass filter 421 basically generates an output having a voltage comparable to the difference signal 430. However, when the difference signal 430 fluctuates sharply, the low-pass filter 421 generates an output signal that does not follow the difference signal 430 perfectly but follows the difference signal 430 with a slight delay. More specifically, in order to absorb a temperature fluctuation and deterioration over time, a low-pass filter having a cutoff frequency in the order of 0.1 Hz or 0.01 Hz is used as the low-pass filter 421.

The second reference voltage generation circuit 422 is connected to the adder 423 and the subtractor 424. The second reference voltage generation circuit 422 generates a second reference voltage and inputs the second reference voltage into the adder 423 and the subtractor 424. The second reference voltage determines a range of a determination threshold in the window comparator 425.

The adder 423 is connected to the window comparator 425 and inputs an upper-limit reference voltage 431, which is a sum when the second reference voltage is added to an output of the low-pass filter 421, into the window comparator 425.

The subtractor 424 is connected to the window comparator 425 and inputs a lower-limit reference voltage 432, which is a difference when the second reference voltage is subtracted from an output of the low-pass filter 421, into the window comparator 425.

The window comparator 425 determines whether a voltage indicated by the difference signal 430 falls within a normal voltage range defined by the upper-limit reference voltage 431 inputted by the adder 423 and the lower-limit reference voltage 432 inputted by the subtractor 424. The window comparator 425 outputs a diagnostic detection signal Vout according to a determination as to whether a voltage indicated by the difference signal 430 falls within the normal voltage range. For example, when a voltage indicated by the difference signal 430 falls within the normal voltage range, the window comparator 425 outputs the diagnostic detection signal Vout which is a high-level voltage signal meaning normality. When a voltage indicated by the difference signal 430 falls outside the normal voltage range, the window comparator 425 outputs the diagnostic detection signal Vout which is a low-level voltage signal meaning abnormality.

The term, "normality or being normal", referred to herein means that the first drive reed 314 and the second drive reed 315 vibrate as desired. The term, "abnormality or being abnormal", referred to herein means that the first drive reed 314 and the second drive reed 315 do not vibrate as desired. In the present embodiment, the window comparator 425 corresponds to a self-diagnostic unit. The common electrodes 319c to 320d are connected to ground potential.

The above has described the configuration of the physical quantity sensor of the present embodiment. A self-diagnosis by the physical quantity sensor will now be described.

Figure 7:
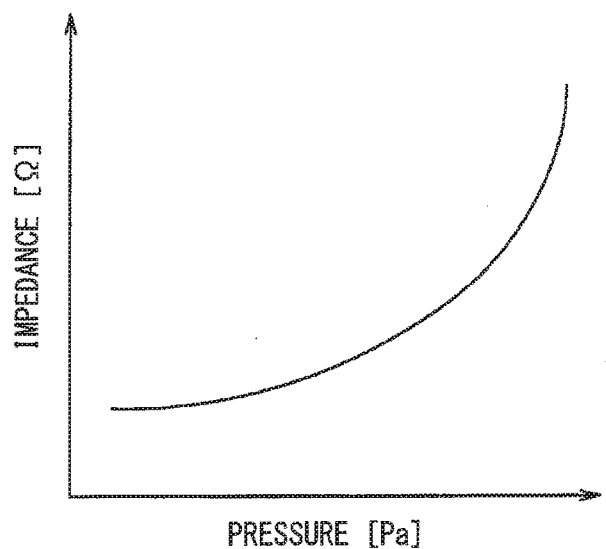
FIG. 7 is a view showing a relation between a pressure and impedance.

In the physical quantity sensor configured as above, a pressure (degree of vacuum) in the housing space 15 rises when leakage occurs at the airtight chamber 255 in the acceleration sensor 20. Hence, as is shown in FIG. 7, impedance at both of the first drive reed 314 and the second drive reed 315 increases and vibrations of the first drive reed 314 and the second driver reed 315 become smaller. In other words, the first drive reed 314 and the second drive reed 315 no longer vibrate normally. Because vibrations of the first drive reed 314 and the second drive reed 315 become smaller, charges generated at the drive electrode 320a of the second drive reed 315 are also reduced.

Hence, a voltage signal converted in the charge amplifier 412 varies and therefore the difference signal 430 outputted by the differential amplifier 415 varies. In short, the difference signal 430 corresponding to the detection environment of the vibrating element 312 is outputted by the differential amplifier 415.

Subsequently, as has been described, the difference signal 430 is inputted into the window comparator 425 by the differential amplifier 415 and whether the difference signal 430 falls within the normal voltage range is determined. When it is determined that the difference signal 430 falls outside the normal voltage range, a voltage meaning abnormality is outputted as the diagnostic detection signal Vout by the window comparator 425. Hence, a fluctuation of a pressure in the housing space 15 is detected. In short, a detection environment of the angular velocity sensor 30 is self-diagnosed.

When a detection environment of the angular velocity sensor 30 is diagnosed as being abnormal, leakage is occurring at the airtight chamber 255 in the acceleration sensor 20. Hence, it can be self-diagnosed that a detection environment of the acceleration sensor 20 is also abnormal.

Figure 8:
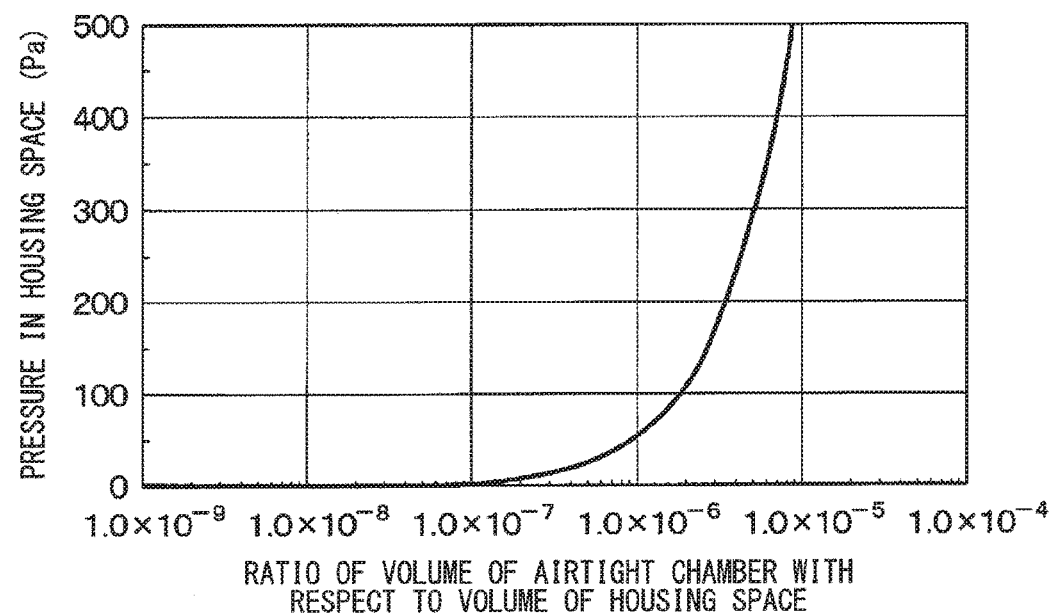
FIG. 8 is a view showing a relation between a pressure in a housing space when leakage occurs at an airtight chamber and a ratio of a volume of the airtight chamber with respect to a volume of the housing space.

In the present embodiment, a ratio of a volume of the airtight chamber 255 with respect to a volume of the housing space 15 is set to $1.0 \times 10^{-7}$ or higher. The ratio is set as above because, as is shown in FIG. 8, when the ratio of a volume of the airtight chamber 255 with respect to a volume of the housing space 15 is set lower than $1.0 \times 10^{-7}$, a pressure in the housing space 15 hardly fluctuates even when leakage occurs at the airtight chamber 255.

As has been described, in the present embodiment, vibration states of the first drive reed 314 and the second drive reed 315 are detected and the difference signal 430 corresponding to the vibration states is outputted by the differential amplifier 415. That is to say, when a pressure in the housing space 15 fluctuates in the event of leakage at the airtight chamber 255, vibration states of the first drive reed 314 and the second drive reed 315 vary. Hence, the difference signal 430 corresponding to a pressure in the housing space 15 is outputted by the differential amplifier 415.

It is the window comparator 425 that determines whether the difference signal 430 falls within the normal voltage range. Hence, a detection environment of the angular velocity sensor 30 (pressure in the housing space 15) can be self-diagnosed. When the detection environment of the angular velocity sensor 30 is diagnosed as being abnormal, leakage is occurring at the airtight chamber 255 in the acceleration sensor 20. Hence, a detection environment of the acceleration sensor 20 can be self-diagnosed as also being abnormal. Consequently, in a case where various types of processing are performed using signals outputted by the acceleration sensor 20 and the angular velocity sensor 30, performance of incorrect processing can be restricted.

(Other Embodiments)

The present disclosure is not limited to the embodiments mentioned above, and can be changed and modified to various embodiments which are also within the spirit and scope of the present disclosure.

For example, the above embodiment has described a case where the acceleration sensor 20 is packaged. However, the angular velocity sensor 30 may be packaged instead. In such a case, the housing space 15 is set to an atmospheric pressure and an airtight chamber in which to seal the sensing portion 322 of the angular velocity sensor 30 is set to a vacuum pressure. Alternatively, both of the acceleration sensor 20 and the angular velocity sensor 30 may be packaged. In such a case, the housing space 15 may be at either an atmospheric pressure or a vacuum pressure.

In the respective embodiments above, the angular velocity sensor 30 may be other than a tripod-type tuning fork. For example, the angular velocity sensor 30 may be a so-called T-type tuning fork in which the first drive reed 314, the second drive reed 315, and the detection reed 316 protrude to both sides with the base portion 317 in between. Further, the angular velocity sensor 30 may be a so-called H-type tuning fork or a normal tuning fork. That is to say, a configuration of the angular velocity sensor 30 is not particularly limited as long as an angular velocity is detected while the vibrating element 312 is vibrating.

In the respective embodiments above, the acceleration sensor 20 may be of a piezoelectric type.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A physical quantity sensor, comprising:
an acceleration sensor provided with a sensing portion outputting a sensor signal corresponding to acceleration;
an angular velocity sensor provided with a sensing portion having an oscillating body that oscillates in a predetermined direction, the sensing portion outputting a sensor signal corresponding to an angular velocity from the sensing portion,
at least one of the acceleration sensor and the angular velocity sensor being of a package structure, in which a cap portion is arranged in a sensor portion where the sensing portion is formed and the sensing portion is hermetically sealed in an airtight chamber defined between the sensor portion and the cap portion;
a case having a housing space set to a predetermined pressure and housing the acceleration sensor and the angular velocity sensor in the housing space;
a detection unit outputting a detection signal corresponding to an oscillation of the oscillating body in the angular velocity sensor;
a self-diagnostic unit self-diagnosing a detection environment of the angular velocity sensor on a basis of the detection signal outputted by the detection unit; and
a circuit board received in the housing space, wherein:
the acceleration sensor is stacked on the circuit board through an adhesive agent,
the circuit board includes the detection unit and the self-diagnostic unit,
the acceleration sensor is of the package structure and the airtight chamber is set to an atmospheric pressure,
the housing space is set to a vacuum pressure, and
a ratio of a volume of the airtight chamber with respect to a volume of the housing space is set to $1.0 \times 10^{-7}$ or higher.

2. A physical quantity sensor, comprising:
an acceleration sensor provided with a sensing portion outputting a sensor signal corresponding to acceleration;
an angular velocity sensor provided with a sensing portion having an oscillating body that oscillates in a predetermined direction, the sensing portion outputting a sensor signal corresponding to an angular velocity from the sensing portion,
at least one of the acceleration sensor and the angular velocity sensor being of a package structure, in which a cap portion is arranged in a sensor portion where the sensing portion is formed and the sensing portion is hermetically sealed in an airtight chamber defined between the sensor portion and the cap portion;
a case having a housing space set to a predetermined pressure and housing the acceleration sensor and the angular velocity sensor in the housing space;
a differential amplifier configured to output a detection signal corresponding to an oscillation of the oscillating body in the angular velocity sensor;
a self-diagnostic unit self-diagnosing a detection environment of the angular velocity sensor on a basis of the detection signal outputted by the differential amplifier; and
a circuit board received in the housing space, wherein:
the acceleration sensor is stacked on the circuit board through an adhesive agent,
the circuit board contains the differential amplifier and the self-diagnostic unit,
the angular velocity sensor is of the package structure and the airtight chamber is set to a vacuum pressure, and
the housing space is set to an atmospheric pressure.

3. A physical quantity sensor, comprising:
an acceleration sensor provided with a sensing portion outputting a sensor signal corresponding to acceleration;
an angular velocity sensor provided with a sensing portion having an oscillating body that oscillates in a predetermined direction, the sensing portion outputting a sensor signal corresponding to an angular velocity from the sensing portion,
at least one of the acceleration sensor and the angular velocity sensor being of a package structure, in which a cap portion is arranged in a sensor portion where the sensing portion is formed and the sensing portion is hermetically sealed in an airtight chamber defined between the sensor portion and the cap portion;
a case having a housing space set to a predetermined pressure and housing the acceleration sensor and the angular velocity sensor in the housing space;
a differential amplifier configured to output a detection signal corresponding to an oscillation of the oscillating body in the angular velocity sensor;
a self-diagnostic unit configured to self-diagnose a detection environment of the angular velocity sensor on a basis of the detection signal outputted by the differential amplifier; and
a circuit board received in the housing space, wherein:
the acceleration sensor is stacked on the circuit board through an adhesive agent,
the circuit board contains the differential amplifier and the self diagnostic unit,
the angular velocity sensor is of the package structure and the airtight chamber of the angular velocity sensor is set to a vacuum pressure, and
the acceleration sensor is of the package structure and the airtight chamber of the acceleration sensor is set to an atmospheric pressure.

4. The physical quantity sensor according to claim 2, wherein
a ratio of a volume of the airtight chamber with respect to a volume of the housing space is set to $1.0 \times 10^{-7}$ or higher.

5. The physical quantity sensor according to claim 3, wherein
a ratio of a volume of the airtight chamber with respect to a volume of the housing space is set to $1.0 \times 10^{-7}$ or higher.

6. The physical quantity sensor according to claim 2, wherein
the sensing portion of the angular velocity sensor includes vibrating elements, and the detection environment is pressure around the vibrating elements.

7. The physical quantity sensor according to claim 6, wherein:
the differential amplifier is configured to output the detection signal representing variation in vibration state of the vibrating elements due to increase in impedance at the vibrating elements and decrease in vibration of the vibrating elements in response to occurrence of leakage in the package structure, and
the self-diagnostic unit is configured to determine that the detection environment is abnormal on determination that the variation in the vibration state is greater than a reference value.

8. The physical quantity sensor according to claim 7, wherein:
the differential amplifier is configured to detect an electric charge generated at the vibrating elements, and
the self-diagnostic unit is configured to determine that the detection environment is abnormal on detection that the electric charge is reduced by a reference level or more, which is caused by increase in impedance at the vibrating elements in response to reduction in vibration of the vibrating elements due to pressure in the package structure that rises in response to occurrence of leakage at the package structure.

9. The physical quantity sensor according to claim 6, further comprising:
a charge amplifier; and
a window comparator, wherein:
the charge amplifier is connected to the vibrating elements and configured to convert an electric charge generated by vibrations of the vibrating elements to a voltage signal,
the differential amplifier is configured to input the voltage signal from the charge amplifier and to output a difference signal, which is a difference between the voltage signal and a reference voltage, corresponding to the detection environment of the vibrating elements,
the window comparator is configured to input the difference signal from the differential amplifier and to determine whether the difference signal falls within a normal voltage range, and
the window comparator is configured to, on determination that the difference signal falls outside the normal voltage range, output a voltage meaning abnormality as a diagnostic detection signal.

10. The physical quantity sensor according to claim 2, wherein
the acceleration sensor is of the package structure and the airtight chamber of the acceleration sensor is set to a vacuum pressure.

11. The physical quantity sensor according to claim 3, wherein:
the sensing portion of the angular velocity sensor includes vibrating elements, and
the detection environment is pressure around the vibrating elements.

12. The physical quantity sensor according to claim 11, wherein:
the differential amplifier is configured to output the detection signal representing variation in vibration state of the vibrating elements due to increase in impedance at the vibrating elements and decrease in vibration of the vibrating elements in response to occurrence of leakage in the package structure, and
the self-diagnostic unit is configured to determine that the detection environment is abnormal on determination that the variation in the vibration state is greater than a reference value.

13. The physical quantity sensor according to claim 12, wherein:
the differential amplifier is configured to detect an electric charge generated at the vibrating elements, and
the self-diagnostic unit is configured to determine that the detection environment is abnormal on detection that the electric charge is reduced by a reference level or more, which is caused by increase in impedance at the vibrating elements in response to reduction in vibration of the vibrating elements due to pressure in the package structure that rises in response to occurrence of leakage at the package structure.

14. The physical quantity sensor according to claim 11, further comprising:
a charge amplifier; and
a window comparator, wherein:
the charge amplifier is connected to the vibrating elements and configured to convert an electric charge generated by vibrations of the vibrating elements to a voltage signal,
the differential amplifier is configured to input the voltage signal from the charge amplifier and to output a difference signal, which is a difference between the voltage signal and a reference voltage, corresponding to the detection environment of the vibrating elements,
the window comparator is configured to input the difference signal from the differential amplifier and to determine whether the difference signal falls within a normal voltage range, and
the window comparator is configured to, on determination that the difference signal falls outside the normal voltage range, output a voltage meaning abnormality as a diagnostic detection signal.

15. The physical quantity sensor according to claim 3, wherein
the housing space is set to an atmospheric pressure.

* * * * *